United States Patent [19]

Seddon

[11] Patent Number: 5,157,272
[45] Date of Patent: Oct. 20, 1992

[54] PULSE FORMING NETWORKS

[75] Inventor: Nigel Seddon, Bristol, United Kingdom

[73] Assignee: British Aerospace Public Limited Company, London, England

[21] Appl. No.: 358,537

[22] Filed: May 26, 1989

Related U.S. Application Data

[63] Continuation of Ser. No. 4,046, Jan. 16, 1987, abandoned.

Foreign Application Priority Data

Jan. 17, 1986 [GB] United Kingdom ............... 8601099

[51] Int. Cl.$^5$ ............................................. G11C 13/02
[52] U.S. Cl. ......................... 307/106; 307/107; 307/419; 307/415; 307/110
[58] Field of Search .................. 307/105–109, 307/410–419, 264, 265, 268, 314; 328/65, 67

[56] References Cited

U.S. PATENT DOCUMENTS

| | | | |
|---|---|---|---|
| 2,719,237 | 9/1955 | Krienen | 307/419 |
| 2,808,520 | 10/1957 | Eckert | 307/416 |
| 2,851,616 | 9/1958 | Thompson | 307/419 X |
| 2,879,389 | 3/1959 | Ingersoll et al. | 307/419 X |
| 3,211,915 | 10/1965 | Poehlman et al. | 307/419 |
| 3,435,431 | 3/1969 | Heckler et al. | 307/106 X |
| 3,611,210 | 10/1971 | Theodore | 307/106 X |
| 3,611,211 | 10/1971 | Theodore | 307/106 X |
| 3,654,489 | 4/1972 | Knapton | 307/107 X |
| 3,711,725 | 1/1973 | Johannessen | 307/107 X |
| 3,786,334 | 1/1974 | Johannessen | 307/107 X |
| 3,845,322 | 10/1974 | Aslin | 307/110 X |
| 3,878,449 | 4/1975 | Wilhelmi et al. | 307/110 X |
| 4,274,134 | 6/1981 | Johannessen | 307/106 X |
| 4,275,317 | 6/1981 | Laudenslager et al. | 307/415 |
| 4,329,595 | 5/1982 | Watson | 307/107 |
| 4,360,867 | 11/1982 | Gonda . | |
| 4,399,376 | 8/1983 | Onodera et al. | 307/415 |
| 4,401,902 | 8/1983 | Onodera et al. | 307/415 |
| 4,417,342 | 11/1983 | McKee . | |
| 4,424,459 | 1/1984 | Inomata et al. | 307/415 |
| 4,467,269 | 8/1984 | Barzen . | |
| 4,532,433 | 7/1985 | Basile . | |
| 4,549,091 | 10/1985 | Fahlen et al. | 307/415 X |
| 4,563,616 | 1/1986 | Stevens . | |
| 4,573,160 | 2/1986 | Cirkel . | |
| 4,605,999 | 8/1986 | Bowman . | |
| 4,612,455 | 9/1986 | Weiner . | |
| 4,612,477 | 9/1986 | Dothan . | |
| 4,614,878 | 9/1986 | Lauchner et al. | 307/107 X |
| 4,684,820 | 8/1987 | Valencia | 307/106 |
| 4,707,619 | 11/1987 | Chu et al. | 307/106 |

OTHER PUBLICATIONS

Yu. V. Makritskii: "Generator of current pulses with sharp leading edge", Instruments and Experimental Techniques, vol. 20. No. 1/1 Jan./Feb. 1977, pp. 130–132, Plenum Publishing Corp., New York.

V. A. Shvets: "Nonlinear multichannel pulse-sharpening line containing ferrite rings with nonrectangular hysteresis loop", Instruments and Experimental Techniques, vol. 25, No. 4, part 1, Jul.–Aug. 1982, New York, USA pp. 908–912.

A. I. Dubnev et al: "Obtaining pulses having a rectangular shape in magneto thyristor shapers", Instruments and Experimental Techniques, vol. 19, No. 3, part 2, May–Jun. 1976, pp. 769–772, Plenum Publishing Corp., New York, USA.

(List continued on next page.)

Primary Examiner—Paul Ip
Attorney, Agent, or Firm—Cushman, Darby & Cushman

[57] ABSTRACT

In a pulse forming electrical circuit suitable for use with a gas discharge laser having continuously falling impedance, there is provided a saturable inductor operable to cause the output impedance of the circuitry to vary with the current drawn by the load thereby ensuring that the matching between the impedance of the circuitry and the load to be better than would be the case if the impedance of the circuitry were fixed.

13 Claims, 1 Drawing Sheet

OTHER PUBLICATIONS

V. A. Ivanov et al: "Powerful current-pulse generator", Instruments and Experimental Techniques, vol. 20, No. 3, May–Jun. 1977, pp. 715–716, Plenum Publishing Corp., New York, USA.

A. V. Barmin et al: "Generator of pulses for magnetron modulation in the centimeter band", Instruments and Experimental Techniques, vol. 21, No. 5, part 1, Sep.–Oct. 1978, pp. 1284–1286, Plenum Publishing Corp., New York, USA.

W. S. Melville: "The use of saturable reactors as discharge devices for pulse generators", Journal of the Institution of Electrical Engineers/Radio Section, vol. 98, No. 53, part III, Paper No. 1034, 1951, pp. 185–207.

C. H. Smith: "Magnetic shielding to multi-gigawatt magnetic switches ten years of amorphous magnetic applications", IEE Transactions on Magnetics, vol. MAG-18, No. 6, Nov. 1982, pp. 1376–1381, IEEE, New York, USA.

G. V. Dolbilov et al: "Application of compression sections and nonlinear shaping circuits in the modulator of a linear induction accelerator", Instrument and Experimental Techniques, vol. 27, No. 4, part 1, Jul.–Aug. 1984, pp. 808–814, Plenum Publishing Corp., New York, USA.

PULSE FORMING NETWORKS

This is a continuation of application Ser. No. 07/004,046, filed Jan. 16, 1987, which was abandoned upon the filing hereof.

BACKGROUND OF THE INVENTION

This invention relates to pulse-forming networks and is particularly concerned with impedance-matched pulse-forming networks.

Pulse-forming networks (PFNs) are used to deliver a flat-top electrical pulse of either current or voltage to an impedance-matched load. In order to obtain maximum energy transfer from the PFN to the load within an allocated time interval, the PFN impedance has to be equal to the load impedance—otherwise the energy transfer is not maximised. Certain loads, for example some laser discharges, have continuously falling impedance and therefore the impedance-matched condition for maximum energy transfer is only satisfied briefly during the PFN discharge resulting in an energy transfer to the load of less than the maximum possible within the allocated interval. This can seriously degrade the performance of the laser.

SUMMARY OF THE INVENTION

According to the present invention, there is provided an electrical circuit including current supply means and a variable impedance load connected to the supply means to draw current therefrom, the supply means including saturable inductor means operable to cause the output impedance of the supply means to vary with the current drawn by the load and hence to vary with the impedance of the load, the presence of the saturable inductor means thereby causing the overall matching between the impedances of the supply means and load to be substantially better than would be the case if the impedance of the supply means were fixed.

The supply means can take the form of a single section or a multiple section inductance/capacitance network for delivery of voltage and current pulses to a load such as a gas discharge laser, with magnetisable material being positioned at least near the inductance of one or more of the sections to render the impedance of the network dependent upon the current drawn by the load.

Alternatively, the supply means can take the form of a pulse-forming high voltage conductor line which delivers high voltage pulses to a load, with a continuous strip of magnetisable material being positioned at least near the conductor line to render the impedance of the line dependent upon the current being drawn by the load.

BRIEF DESCRIPTION OF THE DRAWINGS

For a better understanding of the invention, reference will now be made, by way of example, to the accompanying drawing in which.

DETAILED DESCRIPTION OF THE PRESENTLY PREFERRED EMBODIMENT

Figure 1:
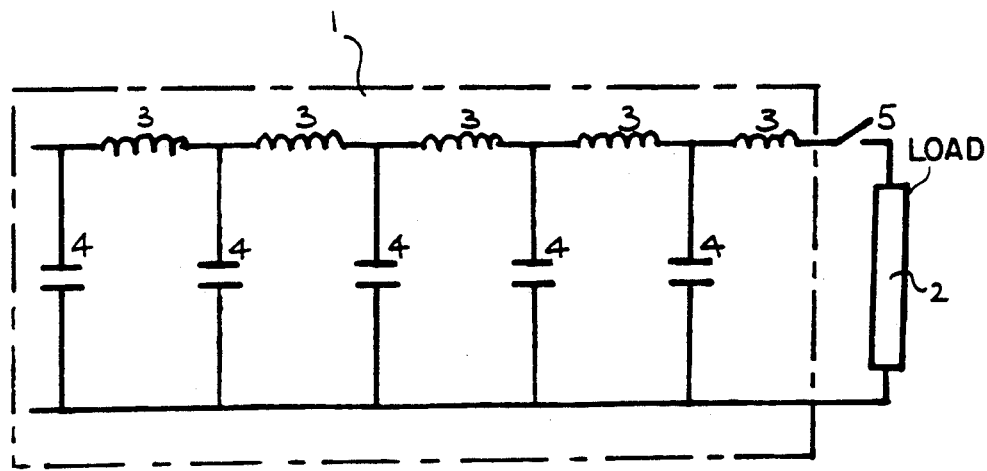
FIG. 1 is a line-simulating, five-section pulse-forming network (PFN)

In FIG. 1, a line-simulating, five-section PFN 1 is shown connected to a load 2. The network 1 comprises five inductors 3, each having an inductance L, and five capacitors 4, each having a capacitance C. When switch 5 is closed, the network 1 delivers a pulse of energy to the load 2. The amount of energy transferred to the load depends on the impedance of both the network $Z_N$ and the load $Z_L$. For maximum energy transfer within the allocated time interval, the impedances need to be matched, i.e. $Z_N = Z_L$. As the total capacitance and inductance for the PFN 1 are fixed because the components making up the network are fixed, the impedance of the network $Z_N$ is given by:

$$Z_N = \sqrt{\frac{L'}{C'}}$$

where L' and C' are the total inductance and capacitance respectively for the network. Therefore, if the load impedance $Z_L$ varies, the amount of energy transferred from the PFN to the load is reduced as the network impendance is no longer matched to that of the load.

The inductors normally used in a PFN are either wire wound coils with air cores or single turn air cored inductors, both of which have fixed inductance. If these inductors were replaced by inductors which contain a magnetic core with a non-linear B-H curve, the inductance of the inductors would be dependent on the permeability of the magnetic material and hence varible.

Figure 2:
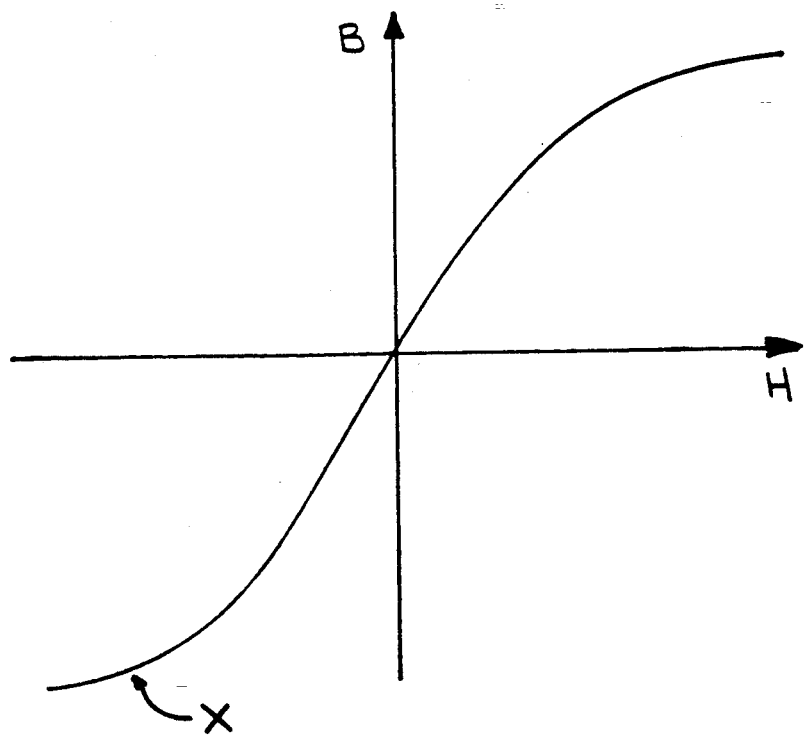
FIG. 2 is a B-H curve for a magnetic material of the type used according to the present invention.

FIG. 2 shows a typical B-H curve for a magnetic material. The permeability of the material is given by the slope of the curve at any point, i.e.:

$$\mu_m = \frac{1}{\mu_o} \cdot \frac{dB}{dH}$$

where
$\mu_m$ is the permeability of the material,
$\mu_o$ is the permeability of free space,
B is the magnetic flux density, and
H is the magnetic intensity.
However, as $$H = \frac{nI}{l},$$

where n is the number of turns of the coil, l is magnetic path length of core, and I is the current flowing through the coil, the permeability of the magnetic material is current-dependent. This leads to the impedance of the inductors being also current-dependent over certain portions of the hysteresis curve. As the magnetic intensity H increases due to an increase in current, the permeability $\mu_m$ changes. The magnetic material may be set prior to the start of the current pulse so as to induce the required change in $\mu_m$. For example, if the material is set at the point X in FIG. 2 an increase in I, and hence H, will produce an increase in $\mu_m$ up to the point where H=O. The material may be set to any point on its B-H loop by positioning a subsidiary current loop around the material or by biasing the material with a permanent magnet. It may be arranged that $\mu_m$ is inversely variable or inversely variable with H.

Therefore, in a PFN having inductors with magnetic cores connected to a load as shown in FIG. 1, in which the impedance varies as shown by the B-H curve of FIG. 2, the network impedance will vary accordingly so that $Z_N = Z_L$ as before and in general, the PFN impedance will tend to follow the load impedance even if the load impedance oscillates.

Naturally, the above applies to any line-simulating PFN, i.e. with any number of sections.

This technique can also be used in pulse-forming lines (PFLs) e.g. high voltage conductors which utilise distributed inductances and capacitances. In such an arrangement, a continuous length of magnetic material is placed near to the conductor to produce the current-dependency of the conductor impedance.

I claim:

1. An electrical pulse-forming circuit comprising:
   current supply means; and
   a variable impedance load connected to the supply means to draw current therefrom;
   said supply means including saturable inductor means, including at least one saturable inductor which has a core formed of a magnetic material with a non-linear B-H curve such that an impedance thereof is current dependent, for supplying current to said load prior to saturation of said saturable inductor means such that the output impedance of the supply means continuously varies with the current drawn by the load and hence continuously varies with the impedance of the load, thereby causing continuous matching between the impedances of the supply means and load as the impedance of the load varies.

2. An electrical circuit according to claim 1, wherein the supply means is in the form of a single section or a multiple section inductance/capacitance network for delivery of voltage and current pulses to the load, magnetizable saturable material being positioned near the inductance of one or more of the sections to cause the impedance of the network to be dependent upon the current drawn by the load.

3. An electrical circuit according to claim 1, wherein the supply means is in the form of a pulse-forming high voltage conductor line which delivers high voltage pulses to the load, a continuous strip of magnetizable saturable material being positioned near the conductor line to render the impedance of the line dependent upon the current being drawn by the load.

4. An electrical circuit according to claim 1 wherein said saturable inductor means has a gradually varying B-H curve.

5. An electrical circuit according to claim 1 wherein said variable impedance load is a laser discharge.

6. An electrical pulse-forming circuit comprising:
   a variable impedance load; and
   current supply means for supplying current to said variable impedance load, said current supply means including saturable inductor means, including at least one saturable inductor which has a core formed of a magnetic material with a non-linear B-H curve such that an impedance thereof is current dependent, for conducting current prior to saturation so as to render the output impedance of said current supply means dependent upon an amount of current drawn by said load, and for continuously matching the impedances of the supply means and load as the impedance of the load varies.

7. An electrical circuit according to claim 6, wherein said saturable inductor means has a non-linear B-H curve.

8. An electrical circuit according to claim 6, wherein the supply means is in the form of an inductance/capacitance network having at least one section for delivery of voltage and current pulses to the load, said saturable inductor means including magnetizable saturable material positioned near an inductance of at least one section of said network so as to cause the impedance of the network to be dependent upon the current drawn by the load.

9. An electrical circuit according to claim 6, wherein the supply means is in the form of a pulse-forming high voltage conductor line which delivers high voltage pulses to the load, said saturable inductor means including a continuous strip of magnetizable saturable material positioned near the conductor line so as to render the impedance of the line dependent upon the current being drawn by the load.

10. A method of continuously matching the impedance of current supply means having an inductance/capacitance network to the impedance of a variable impedance load connected to said current supply means via a switch, said network including at least one saturable inductor means having a magnetic core with a non-linear B-H curve so that the inductance thereof is dependent on the permeability of said magnetic core, said method comprising the steps of:
    setting said magnetic core to a point on its B-H curve at which the permeability of said magnetic core is variable with a magnetic intensity thereof;
    charging a capacitance of said inductance/capacitance network to an applied voltage V;
    applying said applied voltage V to said switch until said switch starts to conduct;
    applying to said load that part of the applied voltage V which is conducted by said switch prior to saturation of said saturable inductor means such that the current drawn by said load through said saturable inductor means provides a continuous matching of the impedances of said network and said load.

11. A method of continuously matching the impedance of current supply means having an inductance/capacitance network to the impedance of a variable impedance load connected to said current supply means via a switch, a magnetizable saturable material being positioned near an inductance of said inductance/capacitance network, said saturable material having a hysteresis loop whose permeability varies with a magnetic intensity thereof, said method including the steps of:
    charging a capacitance of said inductance/capacitance network to an applied voltage V;
    applying said applied voltage V to said switch until said switch starts to conduct;
    applying to said load that part of the applied voltage V which is conducted by said switch prior to saturation of said saturable material such that the current drawn by said load provides a continuous matching of the impedances of said network and said load.

12. A method of continuously matching the impedance of current supply means in the form of a pulse-forming high-voltage conductor line to the impedance of a variable impedance load connected to said current supply means, a continuous strip of magnetizable saturable material being positioned near the conductor line, said saturable material having a hysteresis loop whose permeability varies with a magnetic intensity thereof, said method comprising the steps of:
    applying an applied voltage V to said conductor line for application to said load; and applying to said load that part of the applied voltage V which is conducted prior to saturation of said saturable material such that the current drawn by said load prior to saturation of said saturable material provides a continuous matching of the impedances of said line and said load.

13. A method of continuously matching the impedance of current supply means having a magnetizable saturable material to the impedance of a variable impedance load connected to said current supply means, said saturable material having a hysteresis loop whose permeability varies with a magnetic intensity thereof, said method comprising the steps of:
   applying an applied voltage V to said load from said current supply means; and
   varying the portion of said applied voltage V which is applied to said load prior to saturation of said saturable material such that the current drawn by said load provides a continuous matching of the impedances of said current supply means and said load.

* * * * *